(12) United States Patent
Goldin et al.

(10) Patent No.: US 8,548,312 B2
(45) Date of Patent: Oct. 1, 2013

(54) HIGH EFFICIENCY HIGH ACCURACY HEATER DRIVER

(75) Inventors: Alexander Goldin, San Jose, CA (US); Oleg V. Serebryanov, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 679 days.

(21) Appl. No.: 12/708,648

(22) Filed: Feb. 19, 2010

(65) Prior Publication Data
US 2011/0206358 A1    Aug. 25, 2011

(51) Int. Cl.
*F26B 3/30*    (2006.01)
(52) U.S. Cl.
USPC ............... 392/411; 219/508; 392/407
(58) Field of Classification Search
None
See application file for complete search history.

(56) References Cited

U.S. PATENT DOCUMENTS

| | | | |
|---|---|---|---|
| 4,438,356 A | 3/1984 | Fleischer | |
| 6,051,823 A | 4/2000 | Sandhu | |
| 2003/0029859 A1 | 2/2003 | Knoot et al. | |
| 2006/0051077 A1 | 3/2006 | Kubo | |
| 2008/0019679 A1 | 1/2008 | Kubo | |

FOREIGN PATENT DOCUMENTS

| EP | 1091622 | 4/2001 |
|---|---|---|
| EP | 1100114 | 5/2001 |

OTHER PUBLICATIONS

"AN 3008 NEC Solid State Relays for ATE Applications", *California Eastern Laboratories*, (Oct. 2008), 4 pgs.
PCT International Search Report and Written Opinion in PCT/US2011/025391, mailed Dec. 15, 2011, 12 pgs.
EESR Search Report for EP Application No. 11745298.7, completed Jun. 5, 2013, 6 pages.

*Primary Examiner* — Thor Campbell
(74) *Attorney, Agent, or Firm* — Servilla Whitney LLC

(57) ABSTRACT

A rapid thermal process chamber having a lamp driver circuit that includes two transistors and two diodes is described. The rapid thermal process chamber includes a plurality of halogen lamps, the lamp driver, a temperature sensor that measures wafer temperature, a temperature controller connected to the temperature sensor and to the lamp driver, the temperature controller providing control signals to the lamp driver that are functions of the wafer temperature and a desired temperature. The lamp driver includes two transistors that are controlled by the control signals so that the power factor of the power supplied to the plurality of halogen lamps is in the range of 0.9 to 1.

6 Claims, 6 Drawing Sheets

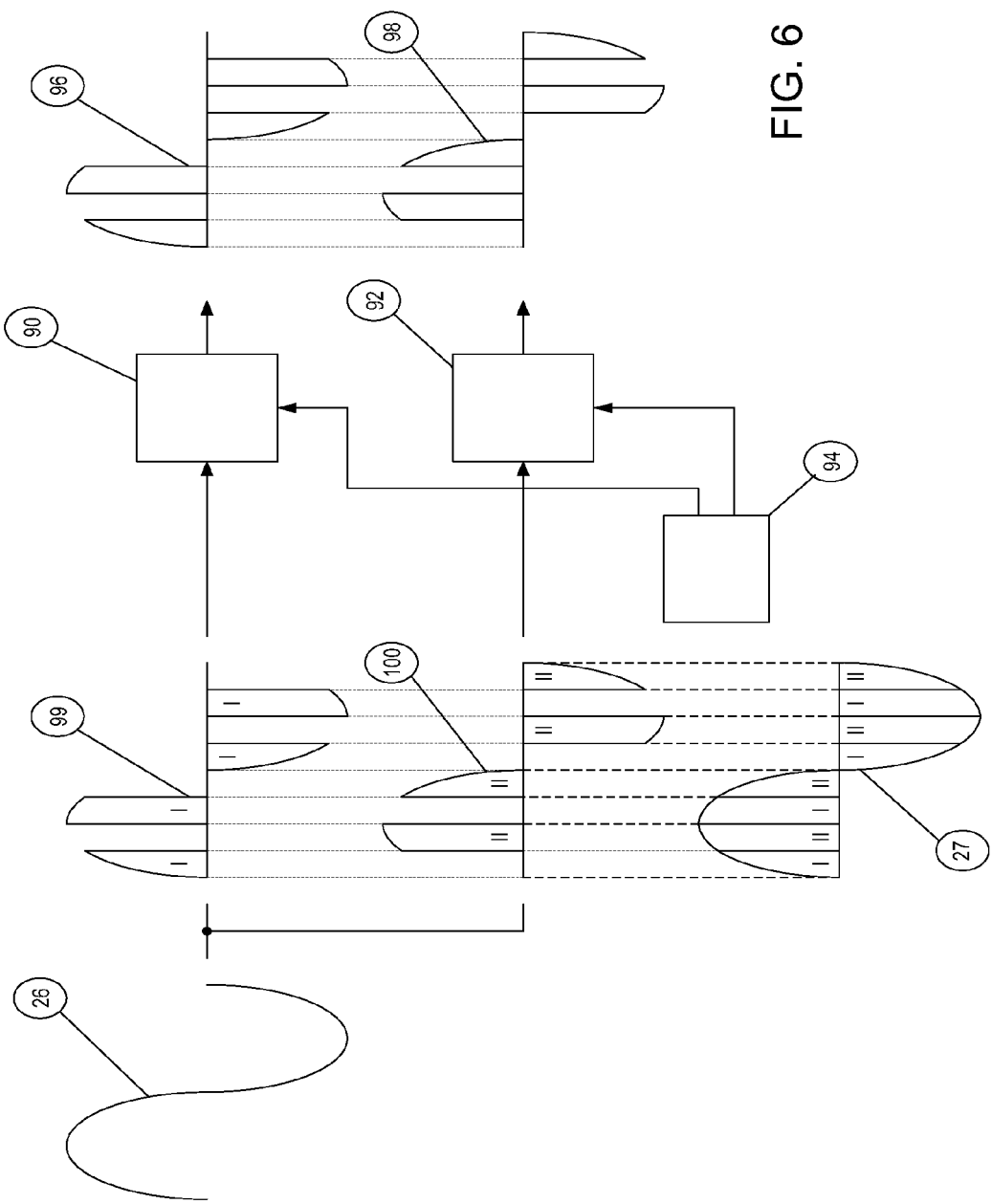

HIGH EFFICIENCY HIGH ACCURACY HEATER DRIVER

FIELD

The present invention relates to a heater driver that can be used in a rapid thermal process chamber to provide more efficient operation when processing wafers.

BACKGROUND

Rapid thermal process (RTP) chambers need to control the power applied to a lamps when processing semiconductor wafers to control the amount of heat generated by the lamps. Current RTP chambers use a lamp driver circuit that includes a phase angled controlled silicon controlled rectifier (SCR) to control the power applied to a lamp to control wafer processing. These SCR based lamp driver circuits suffer from a number of drawbacks that limit the efficiency of wafer processing. One series drawback of the SCR based approach is that the power factor of the circuit is low. This is especially true at low power levels, where the power factor can be less than 50%. This makes semiconductor processing energy inefficient.

Additionally, the SCR based lamp driver circuit cannot be turned on near the points where voltage crosses zero. This is because an SCR requires a minimum voltage to be turned on. Therefore, the minimal value of controlled output current has a threshold. This also contributes to processing inefficiencies.

Another problem is that, because of the nature of a SCR, it can only be switched on and off two times per period. This is because the SCR switches off only when the current through the device is zero. High speed, temperature processing would be improved if more accurate control over a lamp driver circuit could be achieved.

Accordingly, in view of these drawbacks associated with SCR based lamp driver circuits in RTP chambers, new and improved lamp driver circuits are needed

SUMMARY

One aspect of the present invention provides a rapid thermal process chamber that processes a wafer. The rapid thermal process chamber is supplied with AC power and can include a plurality of halogen lamps, a lamp driver, a temperature sensor that measures wafer temperature; and a temperature controller connected to the temperature sensor and to the lamp driver, the temperature controller providing a control signal as a function of the wafer temperature and a desired temperature to a control input of the first transistor and to a control input of the second transistor. The lamp driver comprises a first diode having a cathode connected to a first terminal of a first transistor in parallel with a second diode having a cathode connected to a first terminal of a second transistor, wherein an anode of the first diode and a second terminal of the second transistor is connected to one or more of the plurality of halogen lamps and an anode of the second diode and a second terminal of the first transistor is connected to the AC power supply.

In accordance with another aspect of the present invention, a rapid thermal process chamber that processes a wafer comprises a plurality of halogen lamps, a power source comprising an AC power source with a first switch and a second switch, the power source connected to the plurality of halogen lamps to supply power to the plurality of halogen lamps, a temperature sensor that measures a temperature of the wafer, and a temperature controller connected to the temperature sensor and to the first switch and the second switch in the power source, the temperature controller providing a first control signal to the first switch and a second control sign to the second switch, the first control signal and the second control signal being a function of the wafer temperature and a desired temperature. The first control signal turns the first switch on and off a plurality of times per half cycle of the AC power and the second control signal turns the second switch on and off a plurality of times per half cycle of the AC power.

In accordance with another aspect of the present invention, the first switch is turned on while the second switch is turned off. Also, the first switch is turned off while the second switch is turned on.

In accordance with another aspect of the present invention, the temperature controller forms the first control signal and the second control signals as pulsed versions of the AC power.

In accordance with another aspect of the present invention, the power factor of the power supplied to the plurality of halogen lamps is approximately 1. In general the power factor is between 0.9 and 1.

In accordance with another aspect of the present invention, the first switch and the second switch are transistors. The transistors can be MOSFET transistors, bipolar transistors or insulated gate bipolar transistors.

In accordance with another aspect of the present invention, a method of controlling a rapid thermal process chamber that processes a wafer is provided. The method includes the steps of sensing a temperature of the wafer, determining a desired temperature, a temperature controller generating a first control signal and a second control signal in accordance with the temperature of the wafer and the desired temperature, the first control signal turning a first switch on and off a plurality of times per half cycle of AC power supplied to the temperature controller, the second control signal turning a second switch on and off a plurality of times per half cycle of AC power supplied to the temperature controller and the first and second switch supplying power to a plurality of halogen lamps.

In accordance with another aspect of the present invention, the first switch and the second switch are turned on at different times. The first switch is turned on while the second switch is turned off and the first switch is turned off while the second switch is turned on.

In accordance with another aspect of the present invention, the temperature controller forms the first control signal and the second control signals as pulsed versions of the AC power.

In accordance with another aspect of the present invention, the power factor of the power supplied to the plurality of halogen lamps is approximately 1.

As before, the first switch and the second switch can be transistors. The transistors can be selected from the group consisting of MOSFET transistors, bipolar transistors and insulated gate bipolar transistors.

In another aspect of the present invention, a rapid thermal process chamber that processes a wafer, the rapid thermal process chamber being supplied with AC power, comprises a plurality of halogen lamps, a lamp driver comprising a parallel connection of a first diode and a first transistor with a second diode and a second transistor, the lamp driver being connected to a source of AC power and to the plurality of halogen lamps to supply power to the plurality of halogen lamps, a temperature sensor that measures a wafer temperature and a temperature controller connected to the temperature sensor and to the lamp driver, the temperature controller providing a first control signal as a function of the wafer temperature and a desired temperature to the first transistor and a second control signal as a function of the wafer temperature and the desired temperature to the second transistor. The first transistor is turned on at different times than the second transistor.

The transistors can both be MOSFETS, can both be bipolar transistors or can both be insulated gate bipolar transistors. As be fore, the first and second transistors can be turned on and off two or more times per half period of AC voltage supplied. The power factor of the power supplied to the plurality of halogen lamps is between 0.9 and 1.

DRAWINGS

FIG. 6 illustrates an operation of the present invention in accordance with one aspect of the invention.

DESCRIPTION

Figure 1:
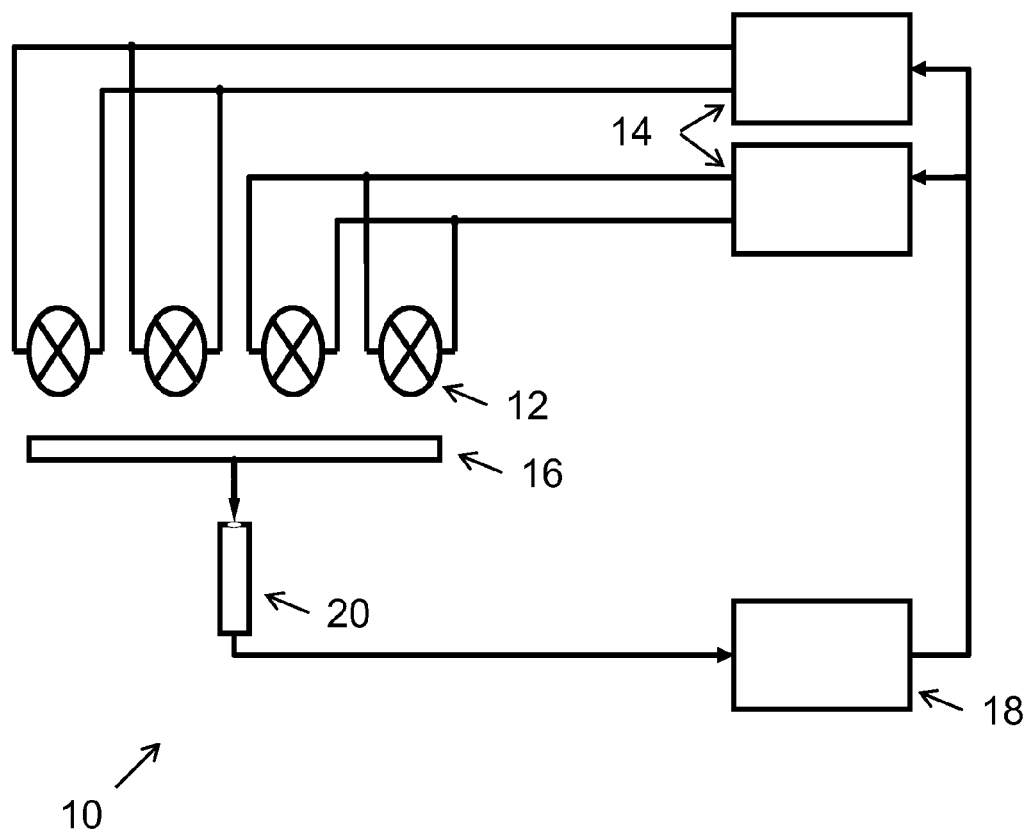
FIG. 1 illustrates a Rapid Thermal Process chamber having halogen lamps, lamp drivers, a wafer temperature controller, a temperature sensor and a temperature controller.

FIG. 1 illustrates a Rapid Thermal Process (RTP) chamber 10. The RTP chamber 10 includes several groups of halogen lamps 12, several lamp drivers 14 and a wafer 16 being processed. The lamp drivers 14 are connected to the halogen lamps 12 and control the power supplied to the halogen lamps 12. The halogen lamps 12 provide heat to the wafer 16 that allow the wafer 16 to be processed in known fashions.

A wafer temperature controller 18 has an input connected to a temperature sensor 20 and an output connected to the lamp drivers 14. The temperature sensor 20 is a noncontact temperature sensor in accordance with one aspect of the present invention, and it measures the temperature of the wafer 16. The temperature is provided from the temperature sensor 20 to the temperature controller 18. A required temperature for the wafer 16 is also provided to the temperature controller 18. The temperature controller 18 sends a control signal based on the measured and required temperature, to the lamp drivers 14 to control the halogen lamps 12. The lamp drivers 14 maintain the required lamp power at the halogen lamps 12 which generates infrared emission to heat the wafer 16.

Figure 2:
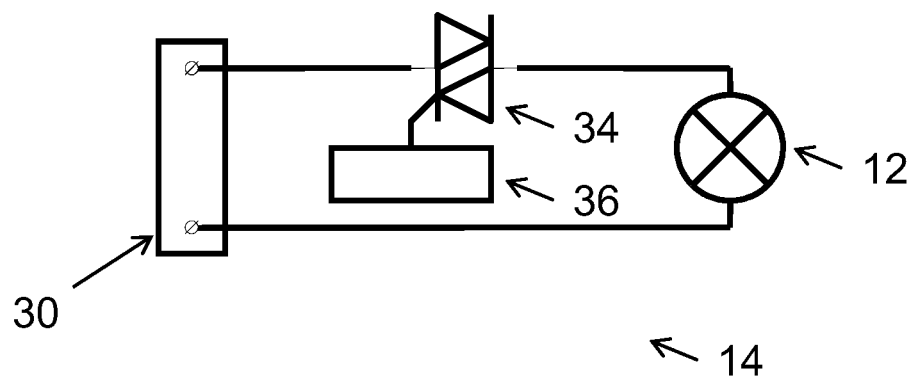
FIG. 2 illustrates a lamp driver in accordance with one aspect of the present invention.

One prior art lamp driver 14 is shown in FIG. 2. The lamp driver 14 is connected to a power source 30. The power source 30 can be a power distribution line. The lamp driver 14 consists of a power control element. In the prior art, for example, a bipolar silicon controlled rectifier (SCR) 34 with a SCR controller 36 is provided. Initially, SCR does not conduct current. Based on external command from controller 18, SCR controller 36 turns the SCR 34 on and off, causing current to flow through the lamp 12. The SCR 34 stops conducting, and the lamp 12 turns off, when the polarity of the control signal provided to the SCR 34 is reversed.

Figure 3:
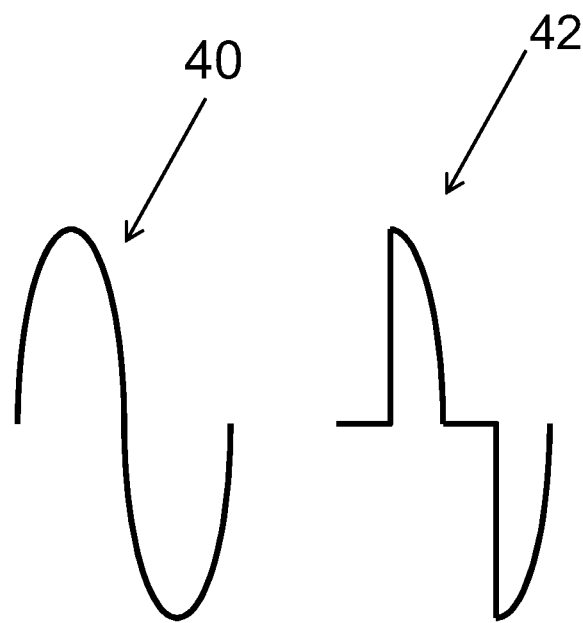
FIG. 3 illustrates voltage from a power source and a driver output voltage in accordance with an aspect of the present invention.

FIG. 3 shows voltage 40 from power source 30 on the left. When a SCR 34 is used, the driver output voltage 42 from the SCR 34 is shown on the right. Of interest, the SCR 34 is typically turned on and off once per half of the AC cycle of the power source 30.

Figure 4:
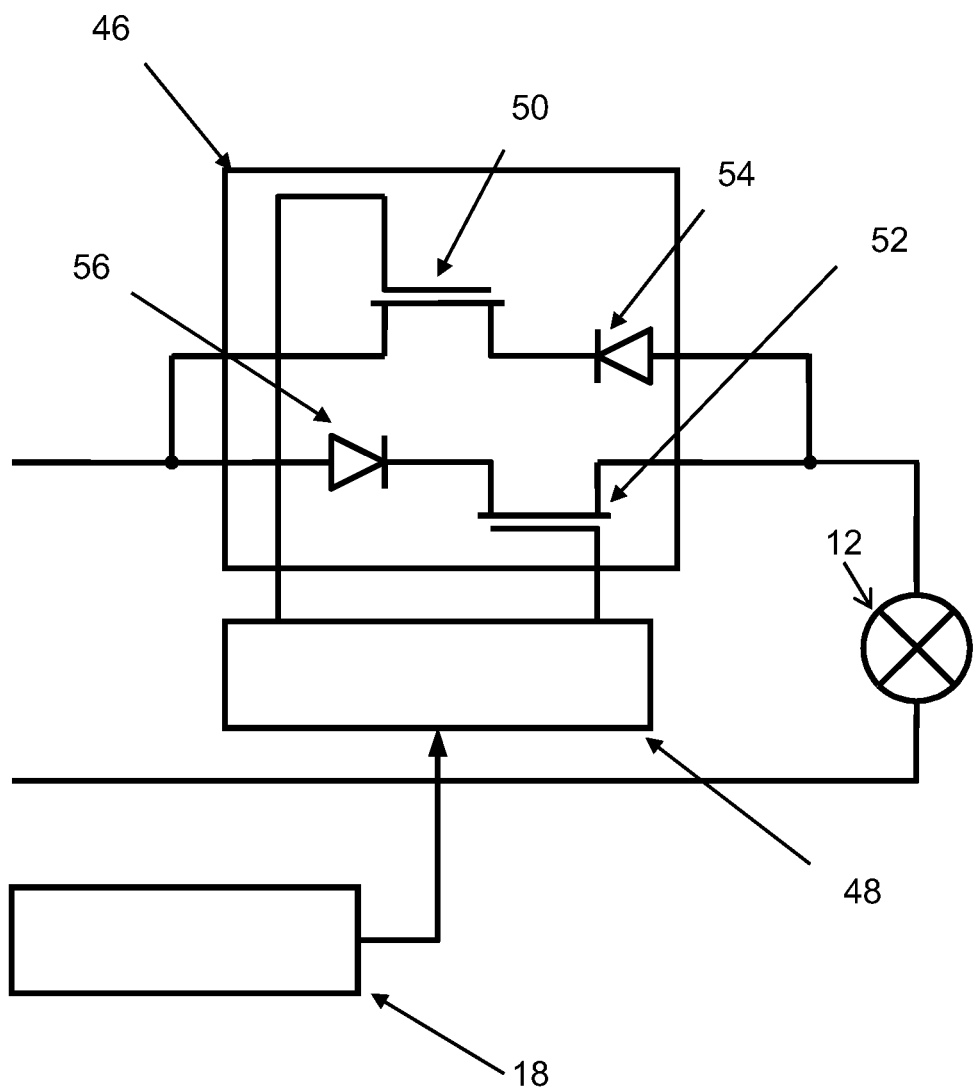
FIG. 4 illustrates a driver circuit in accordance with an aspect of the present invention.

FIG. 4 illustrates the lamp driver in accordance with one aspect of the present invention. The lamp driver has an electronic switch 46 and a controller 48. The electronic switch 44, in accordance with one aspect of the present invention, includes a first transistor 50, a second transistor 52, a first diode 54 and a second diode 56. As illustrated in FIG. 4, the first diode 54 has a cathode connected to a first terminal of the first transistor 50. The second diode 56 has a cathode connected to a first terminal of the second transistor 52. The series connection of the first diode 54 and the first transistor 50 is connected in parallel to the series connection of the second diode 56 and the second transistor 52.

An anode of the first diode 54 and a second terminal of the second transistor 52 is connected to one or more of the plurality of halogen lamps 12. An anode of the second diode 56 and a second terminal of the first transistor 50 is connected to an AC power supply.

The transistors 50 and 52 can be implemented with most types of transistors. For example, the transistors 50 and 52 can be implemented with MOSFET transistors in accordance with one aspect of the present invention. The transistors 50 and 52 can also be implemented with bipolar transistors in accordance with other aspects of the present invention. Further, the transistors 50 and 52 can be implemented with insulated gate bipolar transistors (IGBT). In FIG. 4, the transistors 50 and 52 are shown as MOSFET transistors. The diode 56 and the transistor 52 conduct during the positive portion of an input sine wave. The diode 54 and the transistor 50 conduct during the negative portion of an input sine wave.

Referring to FIG. 4, a controller 48 receives commands from the temperature controller 18. The temperature controller 18 receives a desired temperature as well as the sensed temperature from the temperature sensor 20. The controller 48 analyzes the sensed temperature and the desired temperature and issues control signals to the control input of the transistors 50 and 52 that turn the transistors 50 and 52 on and off to maintain a desired voltage across the lamps 12 so that a desired temperature is maintained.

Figure 5:
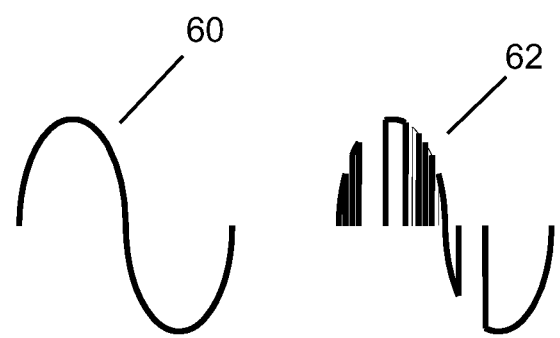
FIG. 5 illustrates waveforms associated with the circuit of the present invention in accordance with an aspect of the invention.

As illustrated in FIG. 5, the controller 48 is capable of turning the transistors 50 and 52 on and off several times per half period of input AC voltage. It accomplishes this by chopping a sine wave form of input voltage 60 into a pulsed voltage 62. The temperature controller 18 can therefore precisely adjust the voltage across the lamp 12 during period of input AC voltage by turning the transistors 50 and 52 on and off two or more times per period of the input AC voltage supply.

FIG. 6 illustrates a lamp heater circuit that includes two driver circuits 90 and 92 in accordance with an aspect of the present invention. Each of the driver circuits 90 and 92 control a group of one or more lamps. In accordance with another aspect of the present invention, a controller 94 staggers the switching phase of drivers 90 to spread the conductive phase during period of AC voltage. Output voltages 96 and 98 are shown for 50% duty cycle. In a case of active load, such as resistors or lamps, the input currents 99 and 100 have the same form as output voltages 96 and 98. Input heater current 27 is a superposition of output currents of multiple drivers. Hence, input current is a superposition of output currents of multiple drivers. For the given example, the resulting form of input current is sinusoidal. The heater input voltage 26 and input current 27 do not have a phase shift between each other and the power factor is approximately 1.

The lamp driver of the present invention can be controlled much quicker than previous lamp circuits that utilized silicon controlled rectifiers. This is because the transistors can be turned on and off much quicker than SCR's, which have a slow response time. Thus, far more accurate control of the halogen lamps 12 is possible using the present invention.

A method of controlling a rapid thermal process chamber that processes a wafer is also provided. The rapid thermal process chamber is supplied with AC power and, as already described, has a plurality of halogen lamps whose power output is controlled by lamp drivers. As described, the lamp driver includes a first diode having a cathode connected to a first terminal of a first transistor in parallel with a second diode having a cathode connected to a first terminal of a second transistor, wherein an anode of the first diode and a second terminal of the second transistor is connected to one or more of the plurality of halogen lamps and an anode of the second diode and a second terminal of the first transistor is connected to the AC power supply.

The process in accordance with one aspect of the present invention, includes sensing a temperature of the wafer with a temperature sensor, transmitting the sensed wafer temperature and a required temperature to a temperature controller, the temperature controller generating a control signal that is sent to a control input of a first transistor and to a control input of a second transistor to turn the first transistor and the second transistor on and off and supplying a signal to the plurality of halogen lamps to control the heat emitted.

Where the first and second transistors in each of the lamp drivers are both a MOSFET, the control input of the first and second transistors is the MOSFET gate. Where bipolar transistors are used, the control input of the first and second transistors is a base terminal.

In accordance with another aspect of the present invention, the temperature controller chops the AC voltage supplied to create control signals for the first and second transistors that turn the first and second transistors on and off two or more times per half period of AC voltage supplied.

The driver circuit of the present inventions gives three benefits: It allows faster setting time of output voltage allows better dynamic accuracy of the process temperature control. The driver according to embodiments of the present invention has maximal achievable speed because it works in the open loop mode. Open loop mode eliminates all negative effects related to an internal closed loop: increasing settling time and overshooting. Static error of the driver is compensated by external wafer temperature control closed loop.

It also allows increased accuracy of the process temperature control at low temperature: Unlike commonly used SCR based driver that utilizes phase angle control method, this driver, for all practical purposes, does not have minimum output voltage whereas the minimal controllable output voltage of prior art SCR based drivers is 5%. Additionally the driver of embodiments of the present invention has better accuracy at low output voltage. Accordingly, the new driver has better power factor and therefore lower energy cost at medium and low power range. This is an advantage because the average power during a rapid thermal processing is in a range of 27%-35%. The typical power factor of prior Rapid Thermal Process systems using the SCR drivers is 0.4. The new driver has power factor better than 0.9 at any controlled power level. In most cases, the power factor is nearly 1.

While there have been shown, described and pointed out fundamental novel features of the invention as applied to preferred embodiments thereof, it will be understood that various omissions and substitutions and changes in the form and details of the device illustrated and in its operation may be made by those skilled in the art without departing from the spirit of the invention. It is the intention, therefore, to be limited only as indicated by the scope of the claims appended hereto.

We claim:

1. A rapid thermal process chamber that processes a wafer, the rapid thermal process chamber being supplied with AC power, comprising:
    a plurality of halogen lamps;
    a lamp driver comprising a parallel connection of a first diode and a first transistor with a second diode and a second transistor, the lamp driver being connected to a source of AC power and to the plurality of halogen lamps to supply power to the plurality of halogen lamps;
    a temperature sensor that measures a wafer temperature; and
    a temperature controller connected to the temperature sensor and to the lamp driver, the temperature controller providing a first control signal as a function of the wafer temperature and a desired temperature to the first transistor and a second control signal as a function of the wafer temperature and the desired temperature to the second transistor; and
    wherein the first transistor is turned on at different times than the second transistor.

2. The rapid thermal process chamber of claim 1, wherein the first and second transistors are both MOSFETS.

3. The rapid thermal process chamber of claim 1, wherein the first and second transistors are both bipolar transistors.

4. The rapid thermal process chamber of claim 1, wherein the first and second transistors are both an insulated gate bipolar transistors.

5. The rapid thermal process chamber of claim 1, wherein the first and second transistors are turned on and off two or more times per half period of AC voltage supplied.

6. The rapid thermal process chamber of claim 5, wherein the power factor of the power supplied to the plurality of halogen lamps is between 0.9 and 1.

* * * * *